US 6,565,364 B1

(12) United States Patent
Yun

(10) Patent No.: US 6,565,364 B1
(45) Date of Patent: May 20, 2003

(54) WAFER FORMED WITH CSP DEVICE AND TEST SOCKET OF BGA DEVICE

(75) Inventor: Sang Jae Yun, Kyungki-do (KR)

(73) Assignee: Mirae Corporation, Choongchungnam-Do (KR)

(*) Notice: Subject to any disclaimer, the term of this patent is extended or adjusted under 35 U.S.C. 154(b) by 0 days.

(21) Appl. No.: 09/469,351

(22) Filed: Dec. 22, 1999

(30) Foreign Application Priority Data

Dec. 23, 1998 (KR) ............................................ 98-57705
Dec. 23, 1998 (KR) ............................................ 98-57706

(51) Int. Cl.[7] .............................................. H01R 12/00
(52) U.S. Cl. ........................................... 439/71; 439/68
(58) Field of Search ......................... 439/73, 83, 931, 439/71, 66, 91, 257, 876, 82, 68, 55, 70; 361/760, 771

(56) References Cited

U.S. PATENT DOCUMENTS

| 4,831,728 A | * | 5/1989 | Barnhouse .................... 29/874 |
| 4,878,846 A | * | 11/1989 | Schroeder ................... 257/724 |
| 4,992,057 A | * | 2/1991 | Smit ............................ 439/83 |
| 5,015,946 A | * | 5/1991 | Janko ........................ 324/72.5 |
| 5,046,957 A | * | 9/1991 | Millhimes ................ 228/180.1 |
| 5,109,320 A | * | 4/1992 | Bourdelaise et al. ........ 361/705 |
| 5,118,298 A | * | 6/1992 | Murphy ........................ 29/827 |
| 5,258,648 A | * | 11/1993 | Lin ............................. 257/778 |
| 5,400,220 A | * | 3/1995 | Swamy ....................... 361/760 |
| 5,419,710 A | * | 5/1995 | Pfaff ............................ 439/266 |
| 5,493,237 A | * | 2/1996 | Volz et al. .................. 324/754 |
| 5,500,605 A | * | 3/1996 | Chang ........................ 324/755 |
| 5,545,050 A | * | 8/1996 | Sato et al. ................... 439/331 |
| 5,578,870 A | * | 11/1996 | Farnsworth et al. ........ 257/727 |
| 5,585,162 A | * | 12/1996 | Schueller .................... 361/749 |
| 5,632,631 A | * | 5/1997 | Fjelstad et al. .............. 439/82 |
| 5,641,945 A | * | 6/1997 | Abe et al. ................... 174/260 |
| 5,691,041 A | * | 11/1997 | Frankeny et al. ........... 257/712 |
| 5,772,451 A | * | 6/1998 | Dozier, II et al. ............ 439/70 |
| 5,855,063 A | * | 1/1999 | Schreiber et al. ............. 29/848 |
| 5,926,375 A | * | 7/1999 | Watanabe et al. ........... 174/250 |
| 5,973,931 A | * | 10/1999 | Fukasawa ................... 361/774 |
| 5,980,270 A | * | 11/1999 | Fjelstad et al. ........ 228/180.22 |
| 6,005,198 A | * | 12/1999 | Gregoire ..................... 174/262 |
| 6,056,558 A | * | 5/2000 | Lin et al. ...................... 439/83 |
| 6,078,505 A | * | 6/2000 | Turudic ...................... 174/255 |
| 6,084,781 A | * | 7/2000 | Klein ......................... 361/771 |
| 6,086,386 A | * | 7/2000 | Fjelstad et al. .............. 439/70 |
| 6,097,609 A | * | 8/2000 | Kabadi ....................... 174/253 |
| 6,142,792 A | * | 11/2000 | Yang ........................... 439/70 |
| 6,200,143 B1 | * | 3/2001 | Haba et al. ................... 29/830 |
| 6,220,870 B1 | * | 4/2001 | Barabi et al. ................. 439/71 |
| 6,062,873 A1 | * | 5/2002 | Kato ............................ 439/66 |

* cited by examiner

Primary Examiner—P. Austin Bradley
Assistant Examiner—Edwin A. León
(74) Attorney, Agent, or Firm—Fleshner & Kim, LLP

(57) ABSTRACT

The present invention relates to a wafer formed with a CSP device and a test socket of a BGA device in which a test socket has a contact member to perform a wiping action for increasing an electric conductivity between a wafer formed with a CSP device and a solder ball formed at a BGA device and a test socket. The present invention provides a test socket including: a contact member block having a slanting face to apply an uniform pressing force to the surface of a solder ball when a BGA device is contacted with the solder ball, formed with a two-dimensionally arranged long hole, the long hole being formed at its central portion with a through hole, the slanting face of the long hole and the surface of the through hole being coated with a conductive material; and a housing formed with a contact member block groove for mounting the contact member block and formed at the upper portion of the groove with a mounting portion for receiving a BGA device.

24 Claims, 15 Drawing Sheets

WAFER FORMED WITH CSP DEVICE AND TEST SOCKET OF BGA DEVICE

BACKGROUND OF THE INVENTION

1. Field of the Invention

The present invention relates to a wafer formed with a CSP device and a test socket of a BGA device in which a test socket has a contact member to perform a wiping action for increasing an electric conductivity between a wafer formed with a CSP device and a solder ball formed at a BGA device and a test socket.

2. Description of the Prior Art

In general, a BGA device formed like a ball grid array (BGA) type reacts with an air thereby to easily form a natural oxide layer when being tested at a high temperature. The natural oxide layer causes an electrical connection between a solder ball and a test device to be deteriorated when the BGA device is tested. Accordingly, the BGA device can not be correctly tested by the test device. Accordingly, a wiping action is required to remove the natural oxide layer on the solder ball.

The conventional test socket of the BGA device for performing the wiping action will now be described with reference to FIG. 1.

FIG. 1 is a sectional view showing a conventional test socket of a BGA device.

FIG. 1 shows a state that the BGA device 1 arranged with the solder ball 1a by a predetermined distance is contacted with a load board 4 by the test socket. A contact member 3 of the test socket is installed at a housing in two-dimension and is at its one end contacted with the solder ball 1a of the BGA device and is at its other end contacted with the load board 4. Under this state, a test signal is transmitted to the BGA device through the load board 4 to be performed the test.

Under the test signal being transmitted to the BGA device 1 the contact member 3 is occurred with a parasitic inductance and a capacitance when being operated at a high frequency region above hundreds of MHz and when the contact member is long. Accordingly, to minimize the phenomenon like that, the contact member 3 should be formed to have S-shape thereby to be shorten its distance. The contact member 3 having S-shape is its one end 3a contacted with the surface of the solder ball 1 a, and, at this time, a wiping action is performed to remove the natural oxide layer on the solder ball 1a.

For the wiping action a housing 2 for fixing the contact member 3 should be formed by an elastic material of non-conductivity. The contact member 3 contacted to the housing 2 bends its one end 3a by a pressing force of the BGA device 1 thereby to perform a movement as a fixing member.

By the elastic force owing to the movement like that the contact member 3 pushes the solder ball 1a by an appropriate force to perform the wiping action. Next, the contact member 3 is returned to its original state when the BGA device 1 is deviated.

The contact member 3 is, as shown in FIG. 1, disposed inside of the housing 2. The contact member 3 being assembled to the housing 2 is manufactured one by one and assembled to the housing 2 thereby causing the manufacturing time of the contact member 3 and the process for assembling to the housing 2 to be increased. Accordingly, a manufacturing time for the test socket is increased.

Furthermore, the modularized contact member 3 forces the solder ball 1a of the BGA device 1 not to be correctly arranged when a vibration is occurred by the contact force. Because the solder ball 1a is at its one side pressed by a pressing force when the contact member 3 performs the wiping action by its one end, the solder ball 1a being contacted to the BGA device 1 is deformed or separated.

That is, because the BGA device 1 become weaken its mechanical strength owing to the low fusion point of the solder ball 1a during a test by a high temperature, the solder ball 1a is received with a non-symmetrical force thereby causing the solder ball 1a of the BGA device 1 to be deformed.

SUMMARY OF THE INVENTION

Accordingly, the present invention has been invented to solve the above problems, it is an object to provide a test socket of a BGA device in which a contact member block formed integrally with two-dimensionally arranged contact member is provided to apply an uniform force to a solder ball of a BGA device when a wiping action is performed.

Another object of the present invention is to provide a test socket of a BGA device in which a contact member is contacted with the surface of a solder ball by an uniform force in order to prevent a deformation or a separation of the solder ball when a wiping action is performed to remove a natural oxide layer.

Other object of the present invention is to provide a test socket in which a contact member is modularized to apply an uniform force to a solder ball in order for a wafer formed with a CSP device to be connected to a test device when the solder ball on the wafer formed with the CSP device and the test device are electrically connected.

To achieve the above objects the present invention provides a test socket comprising: a contact member block having a slanting face to apply an uniform pressing force to the surface of a solder ball when a BGA device is contacted with the solder ball, formed with a two-dimensionally arranged long hole, the long hole being formed at its central portion with a through hole, the slanting face of the long hole and the surface of the through hole being coated with a conductive material; and a housing formed with a contact member block groove for mounting the contact member block and formed at the upper portion of the groove with a mounting portion for receiving a BGA device.

Furthermore, the present invention provides a test socket comprising: a housing formed with a mounting portion for a BGA device and formed inside of the mounting portion with a plurality of two-dimensionally arranged contact member through hole; and a plurality of contact members formed with a coupling portion for being inserted with the through hole, formed at the upper portion of the coupling portion with a square pillar, wherein the square pillar being formed with a long hole having a slanting face to apply an uniform pressing force to the surface of the BGA device when the BGA device is contacted with the solder ball, the slanting face and the surface of the through hole being coated with a conductive material.

The present invention provides a test socket comprising: a wafer housing including a mounting portion for mounting a wafer and two-dimensionally arranged contact member module groove; a contact member module coupled to the groove corresponding to a solder ball of a CSP device on the wafer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Now, preferred embodiments of the present invention will be in detail in detail described with reference to the drawings.

Figure 1:
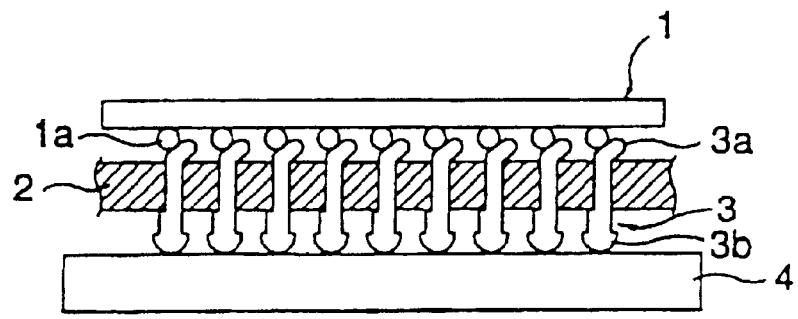
FIG. 1 is a sectional view of a conventional test socket of a BGA device.
Figure 2:
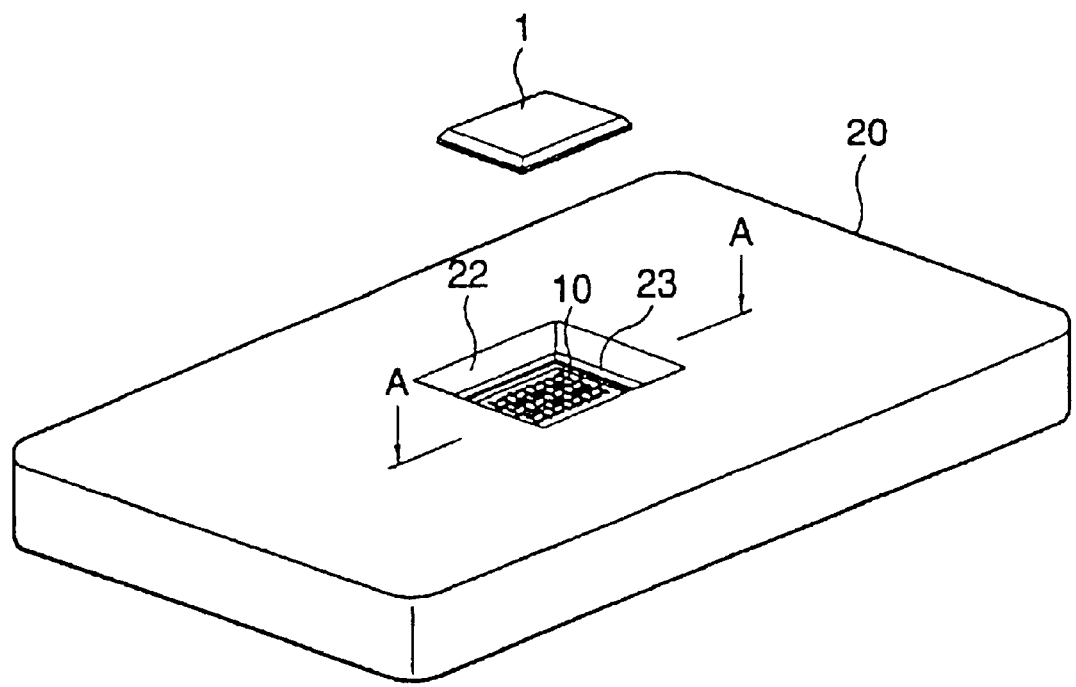
FIG. 2 is a perspective view of a test socket of a BGA device according to the present invention.
Figure 3:
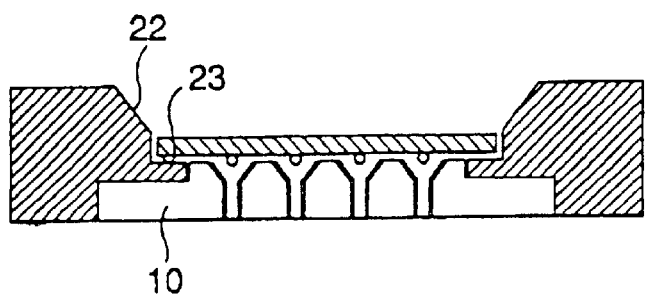
FIG. 3 is a sectional view taken A—A line of the test socket shown in FIG. 2.
Figure 4:
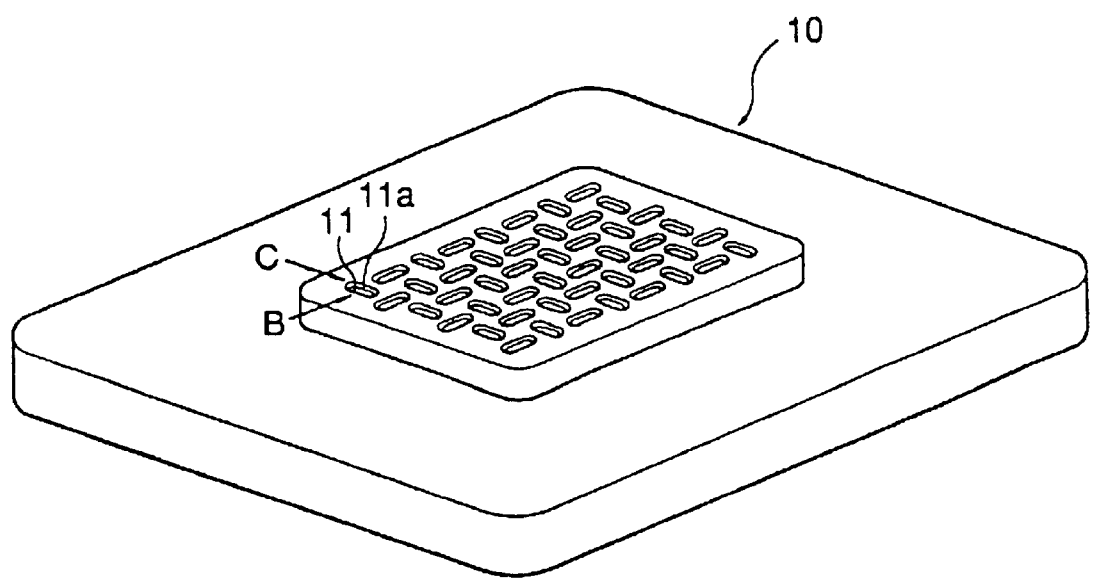
FIG. 4 is a perspective view of the contact member block shown in FIG. 2.

FIG. 2 is a perspective view of a test socket of a BGA device according to the present invention; FIG. 3 is a sectional view taken A—A of the test socket shown in FIG. 2; FIG. 4 is a perspective view of the contact member block shown in FIG. 2.

As shown in FIGS. 2 to 4, a test socket according to the present invention comprises: a contact member block 10 having a slanting face 11a to apply an uniform pressing force to the surface of a solder ball 1a when a BGA device 1 is contacted with the solder ball 1a, formed with a two-dimensionally arranged long hole 11, the long hole 11 being formed at its central portion with a through hole 12, the slanting face 11a of the long hole 11 and the surface of the through hole 12 being coated with a conductive material 13; and a housing 20 formed with a contact member block groove 21 for mounting the contact member block 10 and formed at the upper portion of the groove 21 with a mounting portions 22 and 23 for receiving a BGA device 1.

The contact member block 10 is formed by using the non-conductivity elastic material, such as a silicon rubber. When the contact member block 10 is formed, the long hole 11 having the slanting face 11a is two-dimensionally arranged to apply an uniform pressing force to the surface of the solder ball 1a of the BGA device 1. The long hole 11 is integrally formed by a molding method. Region not formed with the long hole 11 is formed with a step 10a to use as an assembly region with the housing 20.

The long hole 11 formed at the contact member block 10 is at its inside formed with the slanting face 11. The wiping action to remove the natural oxide layer on the solder ball 1a is performed by the slanting face 11a when the contact member block 10 contacts with the solder ball 1a. Furthermore, by having the slanting face 11a on the long hole 11, the circumference length is not changed thereby to be prevented the damage of the conductive material when the long hole is contacted with the square-shaped solder ball 1a. That is, the conductive material coated on the surfaces of the long hole 11 and the through groove 12 is not broken or not get stripped off.

The contact member block 10 integrally formed with the long hole 11 is, as shown in FIG. 4, assembled to the contact member block groove 21 of the housing 20. The groove 21 is, at its upper portion, formed with mounting portions 22 and 23 having the slanting face 22 for arranging the BGA device 1 and the stop face 23 for preventing the excessive movement of the BGA device 1.

When the mounting portions 22 and 23 are placed with the BGA device 1 to be arranged, they are contacted with the contact member block 10 installed at the groove 21. Under this state, the solder ball 1a of the BGA device 1 is arranged on the slanting face 11a of the long hole 1 thereby to be performed the wiping action. By this wiping action the natural oxide layer is removed so that the solder ball 1a is contacted with the slanting face 11a of the long hole 11.

The slanting face 11a is electrically contacted with the solder ball 1a by the conductive material. The long hole 11 is, at its center portion, formed with the through hole 12 passing through the contact member block 10. The through hole 12 is integrally formed with the long hole 11. The through hole 12 is, at its surface, coated with the conductive material 13 thereby to be contacted with the load board 4.

Figure 5A:
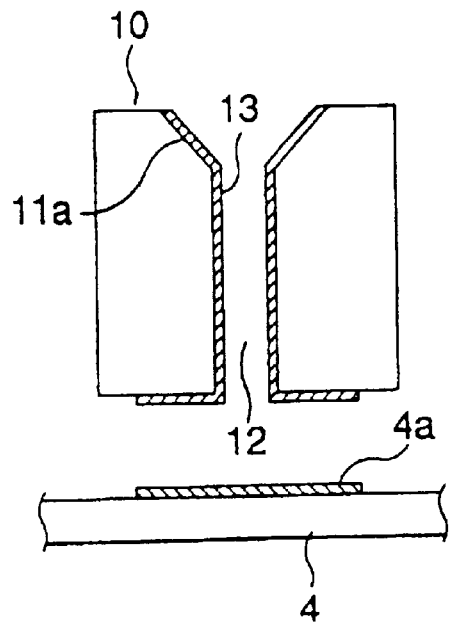
FIGS. 5a and 5b are sectional views taken in B direction and C direction of the long hole shown in FIG. 4.
Figure 5B:
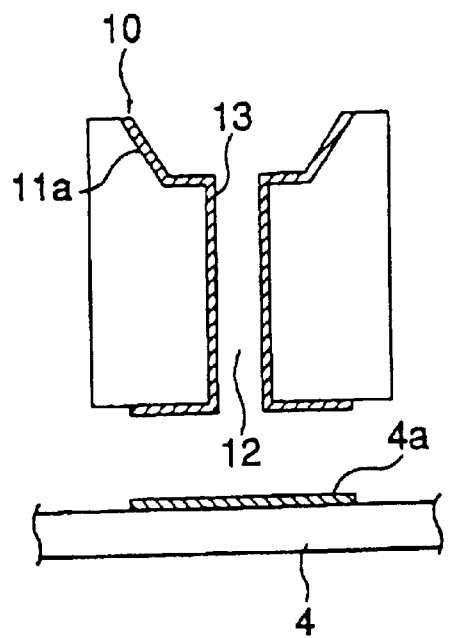

The conductive material coated on the surfaces of the slanting face 11a and the through hole 12 is shown in FIGS. 5a and 5b. FIGS. 5a and 5b are sectional views taken along the B and C directions of the long hole 11.

As shown in FIGS. 5a and 5b, the section areas taken in B direction to be narrow width and C direction to be long width are coated with the conductive material 13.

The conductive material 13 is extended to be coated from the slanting face 11a and the surface of the through hole 12 to the outside bottom portion of the through hole 12 thereby to be electrically contacted with the contact pad 4a of the road board 4.

The conductive material 13 is coated by the non-electrolysis plating manner. The non-electrolysis plating manner is performed to be orderly coated nickel Ni and gold Au.

Figure 6A:
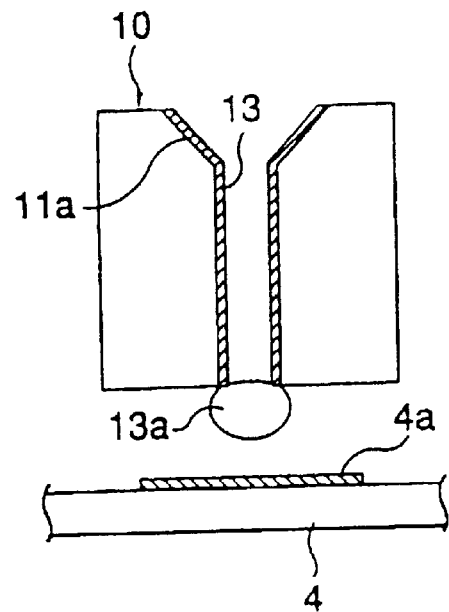
FIGS. 6a and 6b are sectional views of a contact terminal provided at the bottom portion of the long hole shown in FIG. 4.
Figure 6B:
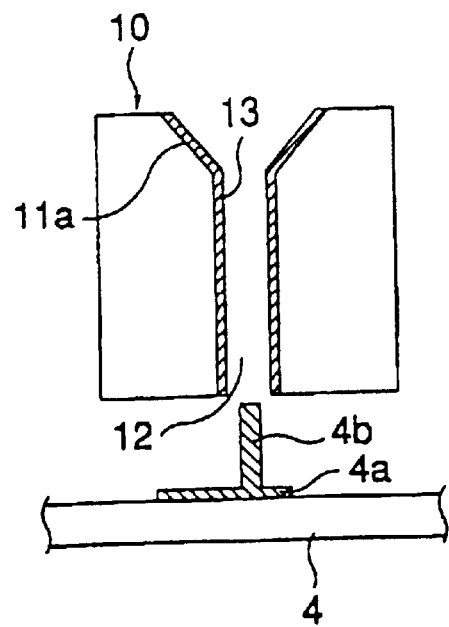

Instead the conductive material 13 coated to be extended to the outside bottom portion of the through hole 12, as shown in FIG. 6a the solder ball 1a may be formed by the conductive ball thereby to be contacted with the load board 4 or, as shown in FIG. 6b the conductive pin 4b may be formed at the load board 4. The pin 4b is formed with the conductive material thereby to be protruded to the contact pad 4a so that it can electrically contact with the conductive material 13 at the inside of through hole 12.

The contact member block 10 to electrically connect the BGA device 1 and the load board 4 is, as shown in FIG. 5, two-dimensionally formed to be crossed the long hole 11 for the arrangement of the BGA device.

The embodiment for arranging the long hole 11 will be now in detail described with reference to the accompanying drawings.

Figure 7:
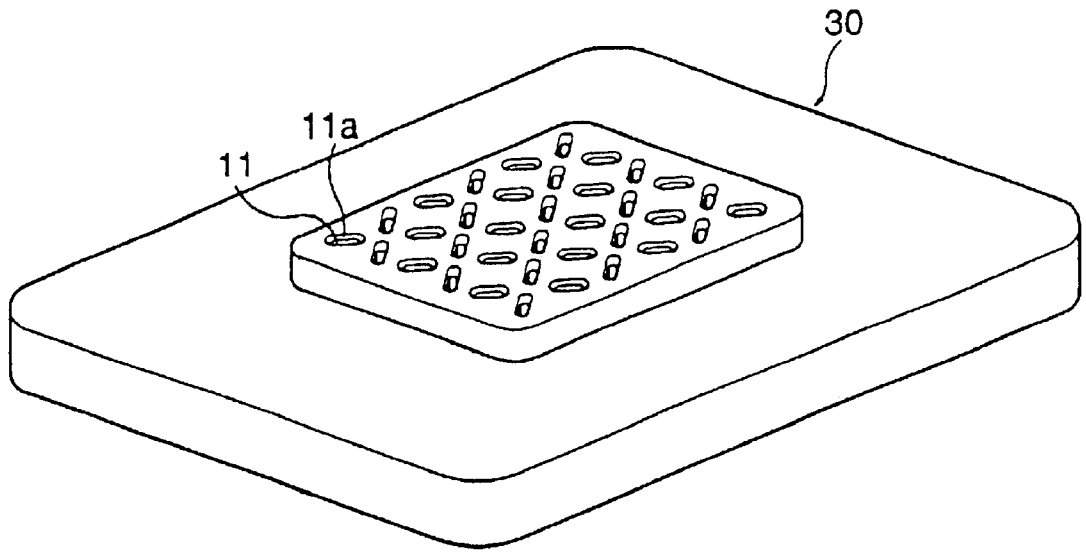
FIG. 7 is a perspective view of a contact member block according to a first embodiment of the present invention.

The first embodiment of the contact member block 10 is that as shown in FIG. 7, the long hole 11 is formed to be slanted by a predetermined angle and the one end of the long hole 11 is arranged with the neighboring long hole 11 to have a predetermined angle thereby to be contacted with the BGA device 1.

Figure 8:
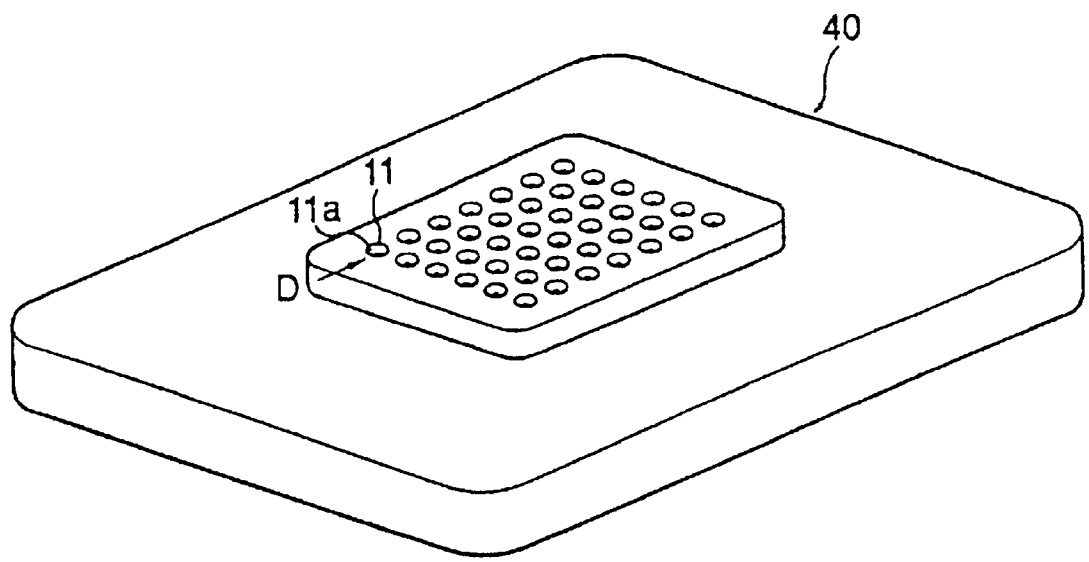
FIG. 8 is a perspective view of a contact member block according to a second embodiment of the present invention.

The second embodiment of the contact member block 10 is that as shown in FIG. 8, the contact member block 40 is formed with a two-dimensionally arranged circular groove 11 thereby to be formed the slanting face therein and is at its center portion, formed with the through hole 12. On the surface of the slanting face 11a and the through hole 12 is coated with the conductive material 13 and as shown in FIG. 9 the conductive material 13 is separately coated to prevent the damage thereof.

Figure 9:
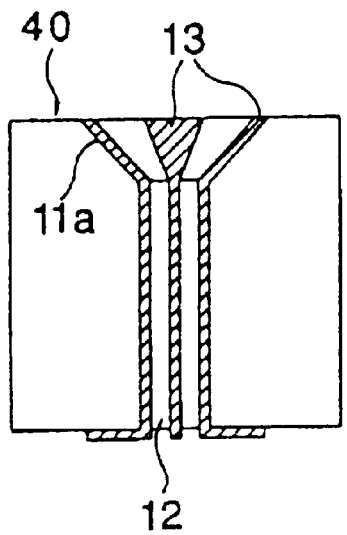
FIG. 9 is a sectional view of a circular groove shown in FIG. 8.

FIG. 9 is a sectional view taken in D direction of circular groove and shows a state that the conductive material 13 is in strip-shaped coated on the slanting face 11 of the circular groove 1 and on the surface of through hole 12. By being coated to be separated, the damage of conductive material 13 can be prevented although the circular groove 11 is deformed owing to be contacted with the solder ball 1a.

Figure 10:
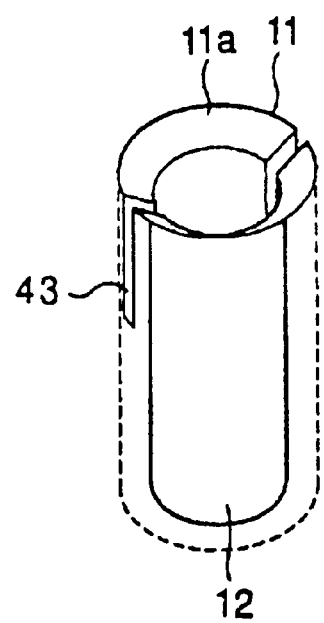
FIG. 10 is a perspective view of a circular groove shown in FIG. 8.

When the conductive material 13 is not coated in strip-shape, the section portion 43 is, as shown in FIG. 10, formed to receive the deformation of the circular groove 11.

As the foregoing description, the contact member module can be easily manufactured by integrally forming the contact member block 10 having the long hole 11 to be electrically connected the BGA device 1 and the load board 4.

Figure 11:
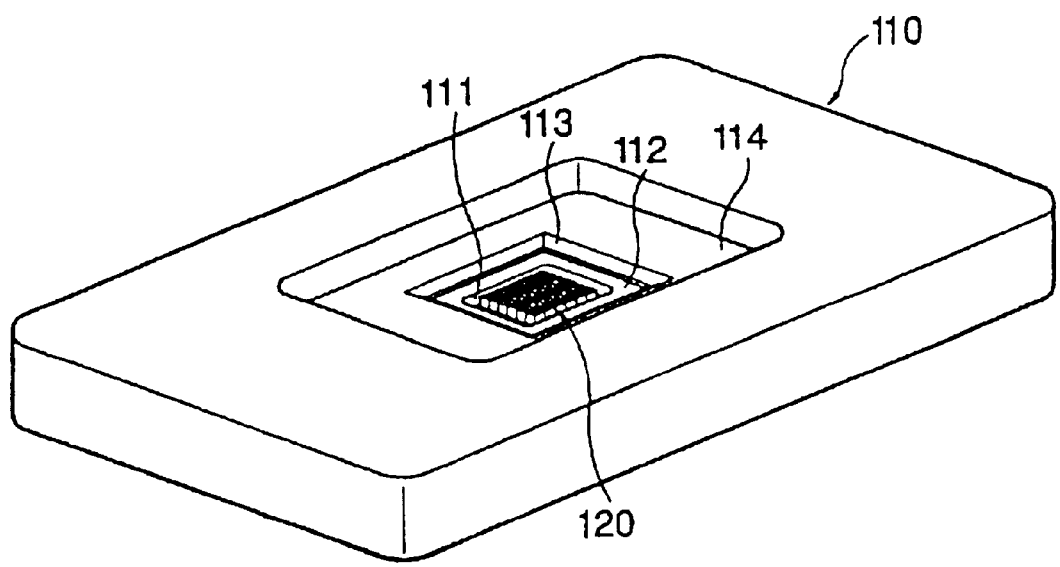
FIG. 11 is a perspective view of a test socket of a BGA device according to the present invention.
Figure 12:
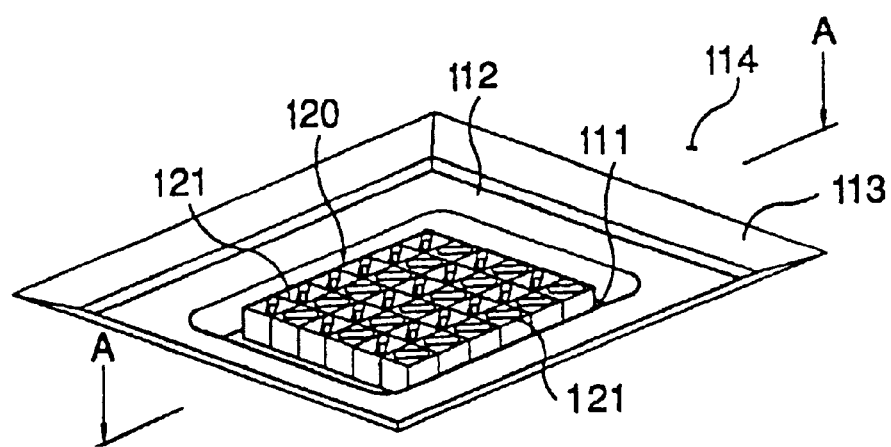
FIG. 12 is a enlarged perspective view of a contact member module shown in FIG. 11.
Figure 13:
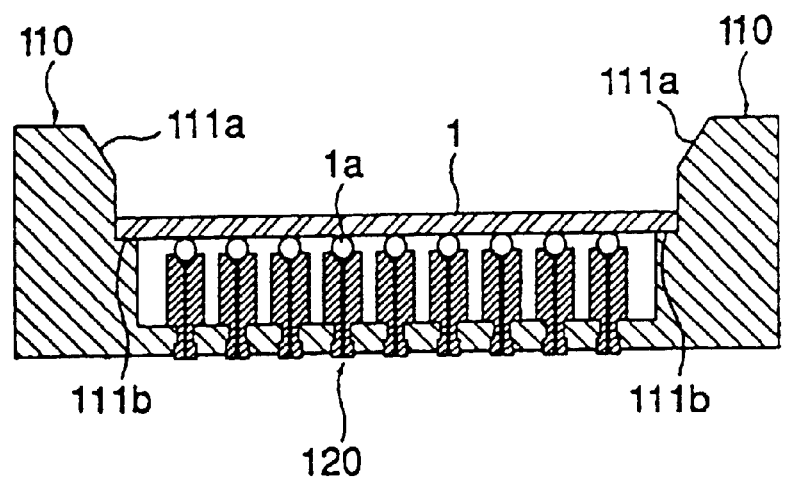
FIG. 13 is a sectional view taken A—A line of a contact member module shown in FIG. 12.
Figure 14:
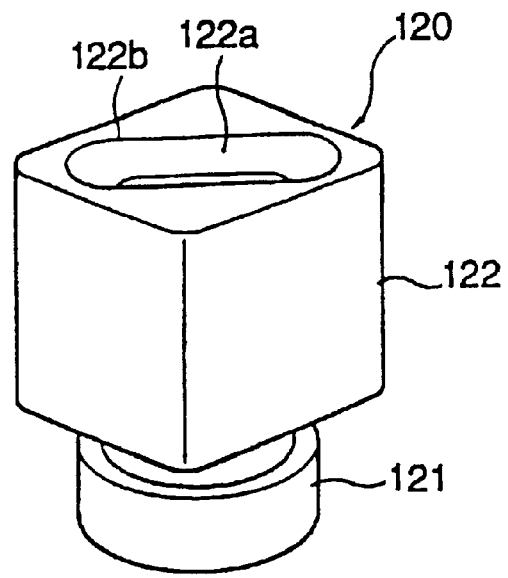
FIG. 14 is a perspective view of a contact member shown in FIG. 12.

FIG. 11 is a perspective view of a test socket of a BGA device according to the present invention; FIG. 12 is a enlarged perspective view of a contact member module shown in FIG. 11; FIG. 13 is a sectional view taken A—A line of a contact member module shown in FIG. 12; and FIG. 14 is a perspective view of a contact member shown in FIG. 12.

As shown in FIGS. 11 to 14, the test socket according to the second embodiment of the present invention is formed with the mounting portions 11a and 11b of the BGA device 1. The mounting portions 111a and 111b are at its inside formed with the housing 110 for being formed a two-dimensionally arranged through hole 112 and with the coupling portion 121 to be coupled with the through hole 112 of the housing 110.

Furthermore, the contact member 120 is constructed such that the coupling portion 121 is at its upper portion formed with the square pillar 122 which is formed with the long hole 122b having the slanting face 122a to apply an uniform pressing force to the solder ball 1a when the pillar 122 is contacted with the solder ball 1a of the BGA device 1.

Furthermore, the coupling portion 121 is at its inside formed with the through hole 123. On the surface of the long hole 122b and the hole 123 the conductive material 124 is coated.

The housing 110 is formed with two-dimensionally arranged contact member 120 corresponding to the solder ball 1a of the BGA device 1. The housing 110 supports the contact member 120 to be fixed and is formed by the material having an insulation property and a mechanical strength thereby preventing a current flowing through the contact member 120 not to be supplied to the housing 110.

The housing 110 is formed with the mounting portions 111 and 111b for mounting the BGA device 1 comprising of the slanting face 111a for arranging the BGA device 1 and the stop face 111b for preventing the excessive contact with the test socket.

A state that the BGA device 1 is mounted at the mounting portions of the housing 110 is shown in FIG. 13.

As shown in FIG. 13, the mounting portions of the housing 110 are, at their inside, formed with a two-dimensionally arranged through hole 112 for being insertedly assembled the contact member 120. The hole 112 is insertedly assembled with the non-conductive elastic contact member 112 corresponding to the solder ball 1a of the BGA device 1 thereby to be mounted by one module.

The contact member 120 for being assembled to the hole 112 is formed by the non-conductive elastic material such as a silicon rubber and is comprised of the coupling portion 121 and the square pillar 122. The coupling portion 121 is formed like a circular column and is formed with portion 121a to be corresponded to the protrusion of the hole 112 thereby to prevent the deviation after being assembled to the hole 112.

Figure 15:
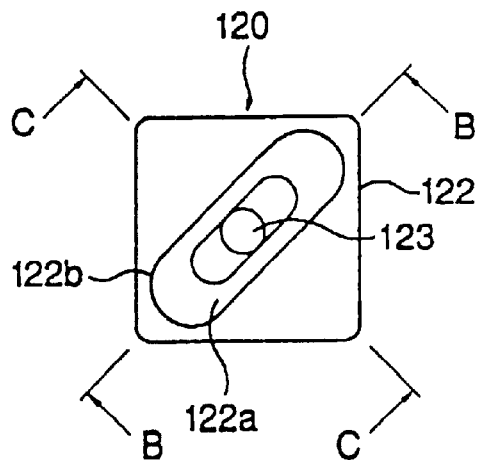
FIG. 15 is a plan-view of a contact member shown in FIG. 13.
Figure 16:
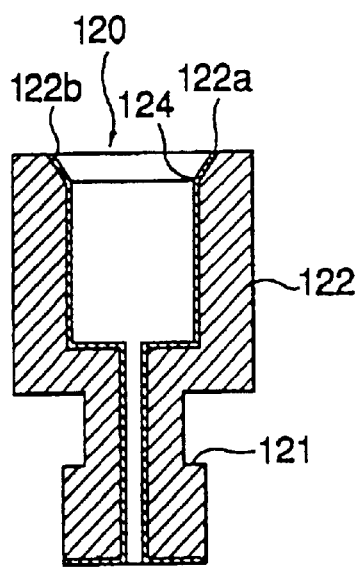
FIG. 16 is a sectional view taken B—B line of a contact member shown in FIG. 14.
Figure 17:
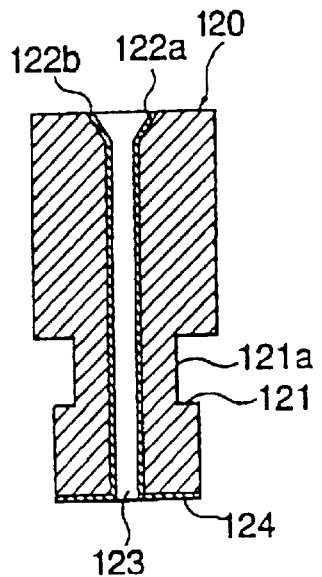
FIG. 17 is a sectional view taken C—C line of a contact member shown in FIG. 14.

The coupling portion 121 is at its upper portion formed with the long hole 122b having the slanting face 122a to press the solder ball 1a of the BGA device 1 to the square pillar 122 as shown in FIGS. 15 to 17.

Referring to FIG. 15, the square pillar 122 of the contact member 120 is at its upper portion formed with the long hole 122b to be a diagonal direction.

The long hole 122b is at its inside formed with the slanting face 122a to be inclined at a predetermined angle. The slanting face 122a provides the contact face when being contacted with the solder ball 1a of the BGA device 1 as shown in FIGS. 16 and 17.

FIG. 16 is a sectional view taken along line B—B of a contact member shown in FIG. 14; and FIG. 17 is a sectional view taken along line C—C of a contact member shown in FIG. 14.

As shown in FIGS. 16 and 17, the contact member 120 is formed toward inside of the long hole 122b formed at the square pillar 122 to be granted by a predetermined angle and the long hole 122b is at its center portion formed with the through hole 123. The hole 123 is formed to be passed through to the bottom portion of the coupling portion 21.

On the slanting face 122a of the contact member 120 and the surface of the hole 123, the conductive material 124 is coated. The conductive material 124 is coated by the manner that the nickel Ni and the gold Au are in order plated to electrically connect with the load board 4. The bottom portion of the coupling portion of the contact member 120 is coated with the conductive material 124.

Figure 18A:
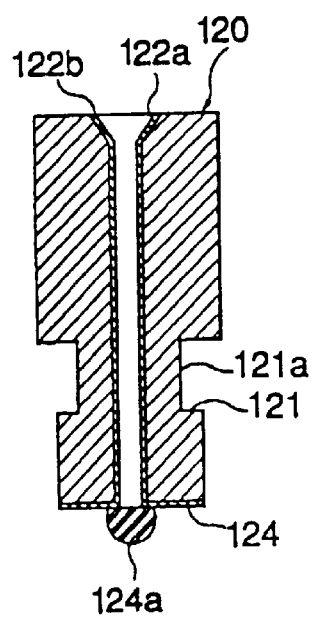
FIGS. 18a and 18b show an embodiment of a contact terminal formed at the bottom portion of a contact member shown in FIG. 17.
Figure 18B:
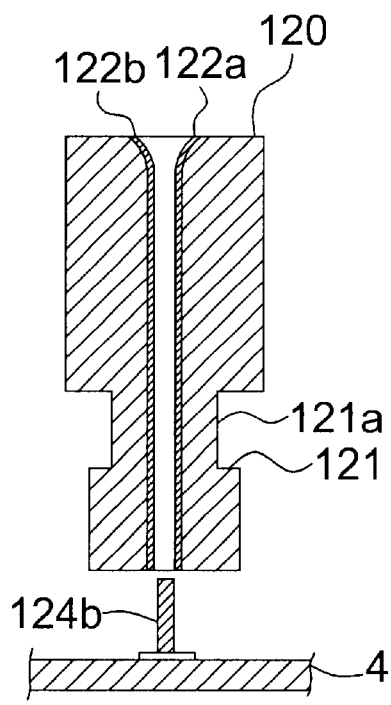

To electrically connect the solder ball 1a and the load board 4 the coupling portion 121 may be at its bottom portion with the conductive ball as shown in FIGS. 18a and 18b, or the load board may be formed with the contact pin 124b.

As shown in FIG. 18a, the coupling portion 121 is at its bottom portion formed with the solder ball 124a to electrically connect with the load board 4.

As shown in FIG. 18b, the load board 4 is formed with the conductive pin 124b to connect with the conductive material coated at the hole 123 of the contact member 120 while the coupling portion 121 is at its bottom portion not coated with the conductive material 124.

Figure 19:
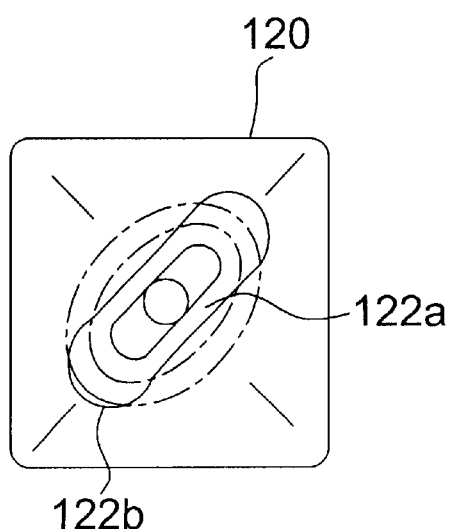
FIG. 19 is an operational state view of a contact member according to the present invention.

The contact member 120 to electrically connect the solder ball 1a and the load board 4 is, as shown in FIG. 19, its long hole 122b changed when being contacted with the solder ball 1a.

As shown in FIG. 19, when the solder ball 1a is pressed to the contact member 120, the long hole 122b is its shape changed as shown in the dot line. This is because the contact member 120 is constructed by the elastic member.

Because the long hole 122b of the contact member 120 is its shape changed it is penetrated to the natural oxide layer on the solder ball 1a thereby to produce the friction force so that the wiping action can be performed to remove the natural oxide layer. The pressing force to the contact member 120 by the solder ball 1a is uniformly distributed to the surface of the solder ball 1a of the long hole 122b thereby to prevent the solder ball 1a to be deformed or be deviated.

As the foregoing description the conductive material 124 coated on the slanting face 122a is changed to have the same length of the circumference of the long hole 122b as the deformation amount of the long hole 122b.

With the natural oxide layer being removed from the surface of solder ball 1a by the long hole 122b, the slanting face 122a formed at the inside of the long hole 122b is served as the contact face of the solder ball 1a thereby to be appropriately arranged the solder ball 1a.

Figure 20:
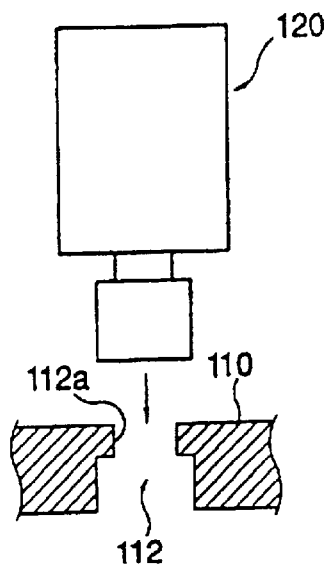
FIG. 20 shows a state that a housing is coupled with a contact member according to the present invention.

The contact member 120 is inserted to the hole 112 as shown in FIG. 20. The long hole of the contact member 120 being assembled to the hole 112 is arranged to have a predetermined angle with the neighboring long hole 122b to arrange the solder ball 1a of the BGA device 1.

FIGS. 21a to 21d show an embodiment of the contact member for preventing the deformation of or deviation of the solder ball 1a during being removed the natural oxide layer.

Figure 21A:
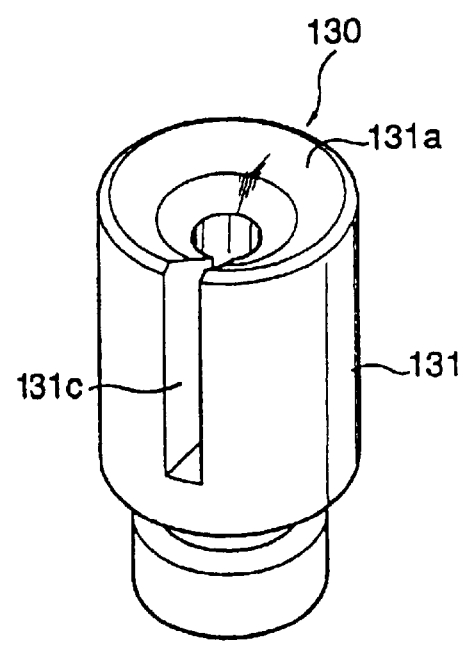
FIGS. 21a to 21d show an embodiment of a contact member according to the present invention.
Figure 21B:
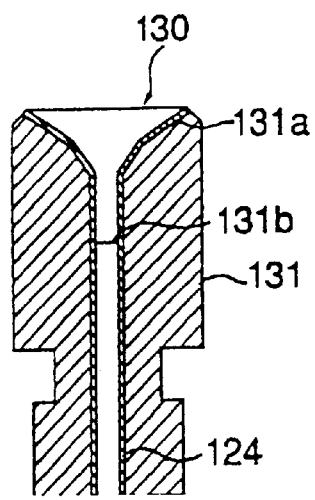

As shown in FIGS. 21a to 21b, the contact member 130 is formed as the circular pillar 131 and is at its inside formed with the slanting face 131a which is at its center portion with the through hole 131b.

On the slanting face 131a and the surface of the through hole 131b the conductive material 124 is coated.

One side of the circular pillar 131 the section area 131c is formed. The section area 131c is formed so that the circular pillar 131 is not deformed to be increased the circumference length, when the solder ball 1a is contacted with the slanting face 131a, thereby prevent the deformation or deviation of the conductive material 124.

When the conductive material 124 is formed on the slanting face 131a to be separated instead of the section area 131c, the damage of the conductive material 124 owing to the deformation of the circular pillar 131 can be prevented.

Figure 21C:
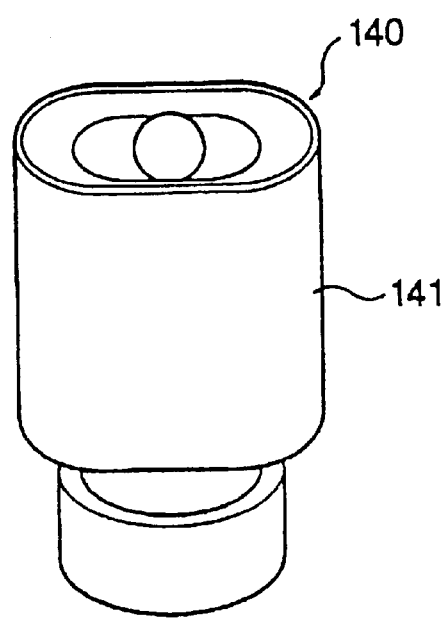
Figure 21D:
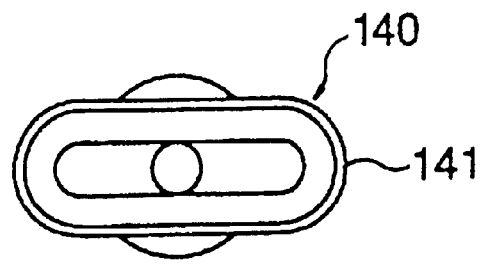

As shown in FIGS. 21c and 21d, the circular pillar 131 can be contacted with the solder ball 1a by forming the circular pillar 131 as the oval pillar 141.

That is, the deformation of conductive material 124 can be prevented by not changing the total amount for deformation when the circular pillar 131 is contacted with the solder ball 1a.

These contact members 120, 130 and 140 are complied with the number of solder ball 1a of the BGA device 1 and is two dimensionally arranged to be assembled to the housing 110. These contact members 120, 130 and 140 arranged to be complied with the number of solder ball 1a is established as one contact module.

Figure 22:
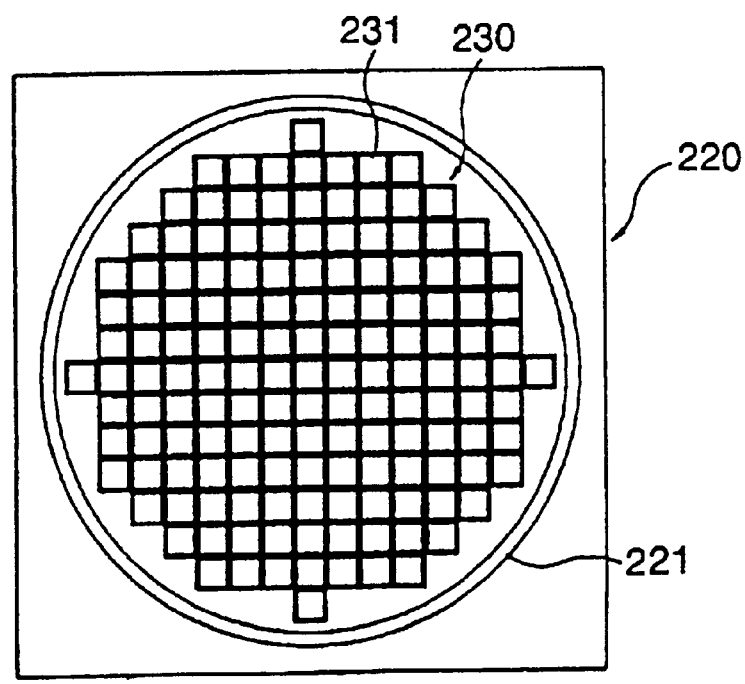
FIG. 22 is a plan view of a test socket of a wafer formed with a CSP device according to the present invention.
Figure 23:
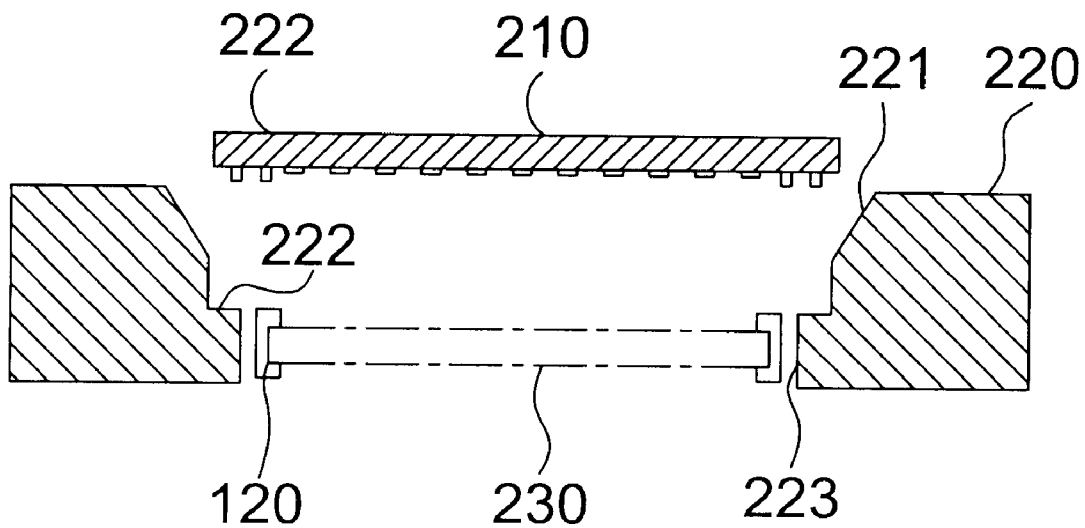
FIG. 23 is a sectional view of a test socket of a wafer formed with a CSP device shown in FIG. 22.

FIG. 22 is a plan view of a test socket of a wafer formed with a CSP device according to the present invention; and FIG. 23 is a sectional view of a test socket of a wafer formed with a CSP device shown in FIG 22.

As shown in FIGS. 22 and 23, the test socket according to the present invention comprises the wafer housing 220 having the mounting portions 221 and 222 for mounting the wafer 210 and contact module grooves 223 formed two-dimensionally at the inside, and the contact module 231 corresponding to the solder ball 211 of the CSP device not shown on the wafer 210 and coupling with the groove 223.

The housing 220 is formed with the wafer mounting portions 221 and 222 for mounting the wafer 210 to be tested. The wafer mounting portions 221 and 222 are formed with the slanting face 221 for arranging the wafer 210 formed with the CSP device and with the stop face 222 for preventing the excessive movement of the wafer 210.

The stop face 222 is at its inside formed with the contact module groove 223 for installing the contact module 231 in two-dimensional. The groove 223 is inserted with the contact module 231 to be assembled. One of the contact member module 231 should be manufactured to be contacted with the solder balls 1a formed at the CSP device.

The contact member 120 provided at the inside of the contact member module 231 is shown in FIG. 14, other type contact member 120 may be used. The contact member module 231 is as shown in FIG. 22 two dimensionally arranged to be installed and comprises of a plurality of contact modules 231 to contact the CSP devices on one wafer with the test device not shown.

That is, under the CSP device not being separated one by one the contact member 120 may be installed to test the CSP device thereby to connect to the test device.

Having described specific preferred embodiment of the invention with reference to the accompanying drawings, it is to be understood that various changes and modifications may be effected therein by one skilled in the art without departing from the scope or spirit of the inventions as defined in the appended claims.

As the foregoing description, the present invention has advantages that the deformation or deviation of the solder ball can be prevented when the contact member performs on wiping action. Furthermore, by modularized the contact member the CSP device on the wafer can be electrically connected with the test device.

Further, because the contact member block is integrally formed to electrically connect the solder ball of the BGA device and the load board of the test device the process for manufacturing the BGA device and the manufacturing time can be decreased thereby to down cost and to increase a productivity.

What is claimed is:

1. A test socket comprising:
a contact member block having a plurality of through holes passing therethrough, wherein a slanting face is formed at an upper portion of each through hole, wherein the slanting faces of the through holes are configured to apply a uniform pressing force to surfaces of corresponding solder balls of a BGA device when the BGA device is pressed into contact with the contact member block and wherein the slanting faces of the through holes and interior surfaces of the through holes are coated with a conductive material; and a housing having a contact member block groove for mounting the contact member and a mounting portion for receiving a BGA device, wherein the slanting faces of the through holes are shaped as long holes, and wherein each of said long holes is formed to be crossed with a neighboring long hole.

2. The test socket in accordance with claim 1, wherein said contact member block is formed by a silicon rubber.

3. The test socket in accordance with claim 1, wherein bottom portions of the through holes are coated with a conductive material or attached to corresponding solder balls to provide electrical connections to an external load board.

4. The test socket in accordance with claim 1, wherein said conductive material comprises a layer of nickel and a layer of gold.

5. The test socket in accordance with claim 1, wherein the contact member block comprises an elastic material.

6. The test socket in accordance with claim 1, wherein the slanting faces of the through holes are configured to perform a wiping action on the surfaces of the solder balls when the BGA device is pressed into contact with the contact member block, thereby removing any natural oxide layer that has formed on the solder balls.

7. A test socket comprising:

a contact member block having a plurality of through holes passing therethrough, wherein a slanting face is formed at an upper portion of each through hole, wherein the slanting faces of the through holes are configured to apply a uniform pressing force to surfaces of corresponding solder balls of a BGA device when the BGA device is pressed into contact with the contact member block and wherein the slanting faces of the through holes and interior surfaces of the through holes are coated with a conductive material; and a housing having a contact member block groove for mounting the contact member and a mounting portion for receiving a BGA device, wherein the slanting faces of the through holes are shaped as long holes, and wherein each of said long holes is formed to be slanted at a predetermined angle and is formed to have a predetermined angle to the neighboring long hole.

8. The test socket in accordance with claim 7, wherein said contact member block is formed by a silicon rubber.

9. The test socket in accordance with claim 7, wherein bottom portions of the through holes are coated with a conductive material or attached to corresponding solder balls to provide electrical connections to an external load board.

10. The test socket in accordance with claim 7, wherein said conductive material comprises a layer of nickel and a layer of gold.

11. A test socket comprising:

a housing having a mounting portion for a BGA device and a contact member mounting portion with a plurality of contact member mounting holes; and a plurality of contact members inserted into corresponding ones of the contact member mounting holes, wherein each of said contact members has a through hole and a slanting face that is configured to apply a uniform pressing force to the surface of a solder ball of a BGA device when the BGA device is pressed into contact with the test socket, and wherein the slanting face and an interior surface of the through hole of each contact member are coated with a conductive material, wherein said contact members are arranged such that longitudinal axes of the slanting faces of the contact members are arranged at predetermined angles with respect to each other.

12. The test socket in accordance with claim 11, wherein said housing includes a slanting face for arranging the BGA device and a stop face for preventing an excessive movement of the BGA device.

13. The test socket in accordance with claim 11, wherein said contact member is formed of a non-conductive elastic material and wherein a coupling portion is configured to be inserted into a contact member mounting hole of the housing.

14. The test socket in accordance with claim 11, wherein a longitudinal axis of said slanting face of each contact member is diagonal to a longitudinal axis of the housing.

15. The test socket in accordance with claim 11, wherein said conductive material is coated on the slanting faces and the interior surfaces of the through holes of the contact members by a non-electrolysis plating method such that a nickel layer and a gold layer are in order coated formed.

16. The test socket in accordance with claim 11, wherein said slanting face of each contact member is oval shaped.

17. The test socket in accordance with claim 11, wherein a coupling portion is formed at a bottom portion of each contact member, and wherein the coupling portion is coated with a nickel layer and a gold layer by a non-electrolysis plating method .

18. The test socket in accordance with claim 11, wherein a coupling portion is formed at a bottom of each contact member, and wherein a solder ball is coupled to each coupling portion to electrically couple each contact member to a load board.

19. The test socket in accordance with claim 4, wherein the plurality of contact members comprise an elastic material.

20. The test socket in accordance with claim 11, wherein the slanting face is configured to perform a wiping action on the surface of a solder ball of a BGA device when the BGA device is pressed into contact with the test socket, thereby removing any natural oxide layer that has formed on the solder ball.

21. A test socket comprising:

a wafer housing including a mounting portion for mounting a wafer and a two-dimensionally arranged contact member module groove; and a contact member module, coupled to the groove, and configured to receive solder balls of a CSP device on the wafer, wherein said contact member comprises a plurality of contact members, wherein each contact member includes a slanting face configured to receive a solder ball and a through hole, wherein the slanting face and an inner surface of the through hole are coated with a conductive material, wherein said slanting face is configured to apply a uniform pressing force on a solder ball when a wafer having a CSP device is pressed into contact with the wafer housing, and wherein the slanting faces of the through holes are shaped as long holes, and wherein each of said long holes is formed to be slanted at a predetermined angle and is formed to have a predetermined angle to the neighboring long hole.

22. The test socket in accordance with claim 21, wherein the contact member module comprises an elastic material.

23. The test socket in accordance with claim 21, wherein said contact member module comprises a plurality of contact members, wherein each contact member includes a slanting face configured to receive a solder ball and a through hole wherein the slanting face and an inner surface of the through hole are coated with a conductive material, and wherein said slanting face is configured to apply a uniform pressing force on a solder ball wafer having a CSP device is pressed into contact with the wafer housing.

24. The test socket in accordance with claim 23, wherein the slanting face is configured to perform a wiping action on the surface of a solder ball of a BGA device when the BGA device is pressed into contact with the test socket, thereby removing any natural oxide layer that has formed on the solder ball.

\* \* \* \* \*